United States Patent
Koshiishi et al.

(10) Patent No.: US 9,627,400 B2
(45) Date of Patent: Apr. 18, 2017

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventors: Kenji Koshiishi, Yokohama (JP); Junji Kataoka, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/613,489

(22) Filed: Feb. 4, 2015

(65) Prior Publication Data
US 2015/0270282 A1 Sep. 24, 2015

(30) Foreign Application Priority Data
Mar. 20, 2014 (JP) .................. 2014-057971

(51) Int. Cl.
*H01L 27/115* (2006.01)
*H01L 27/11582* (2017.01)
(Continued)

(52) U.S. Cl.
CPC .... *H01L 27/11582* (2013.01); *H01L 27/1157* (2013.01); *H01L 29/66666* (2013.01); *H01L 29/66833* (2013.01); *H01L 29/7926* (2013.01)

(58) Field of Classification Search
CPC ......... H01L 27/11582; H01L 29/66833; H01L 29/66666; H01L 29/7926; H01L 27/1157
See application file for complete search history.

(56) References Cited

U.S. PATENT DOCUMENTS

2009/0310425 A1* 12/2009 Sim ................... H01L 27/11526
365/185.29
2010/0142257 A1  6/2010 Masuoka et al.
(Continued)

FOREIGN PATENT DOCUMENTS

JP    2010-225946    10/2010
JP    2012-195424    10/2012
(Continued)

OTHER PUBLICATIONS

Combined Office Action and Search Report issued Jul. 1, 2016 in Taiwanese Patent Application No. 104107305 with English translation.

*Primary Examiner* — Ermias Woldegeorgis
(74) *Attorney, Agent, or Firm* — Oblon, McClelland, Maier & Neustadt, L.L.P.

(57) ABSTRACT

According to one embodiment, a nonvolatile semiconductor memory device includes an interconnect layer, a stacked body, an insulating layer, a semiconductor pillar, a charge storage layer and a first conductive unit. The stacked body is separated from the interconnect layer in a first direction. The stacked body includes a memory unit and a selection gate provided between the memory unit and the interconnect layer. The insulating layer is provided between the interconnect layer and the stacked body. The semiconductor pillar pierces the stacked body in the first direction. The charge storage layer is provided between the semiconductor pillar and the memory unit. The first conductive unit connects the semiconductor pillar and the interconnect layer. A width of the first conductive unit along a second direction perpendicular to the first direction is wider than a width of the semiconductor pillar along the second direction.

14 Claims, 6 Drawing Sheets

(51) Int. Cl.
*H01L 29/792* (2006.01)
*H01L 29/66* (2006.01)
*H01L 27/1157* (2017.01)

(56) References Cited

U.S. PATENT DOCUMENTS

2010/0187588 A1 7/2010 Kim et al.
2010/0244119 A1* 9/2010 Fukuzumi ......... H01L 27/11578
 257/324
2012/0182801 A1 7/2012 Lue

FOREIGN PATENT DOCUMENTS

JP 2014-11389 1/2014
TW 201338138 A 9/2013

* cited by examiner

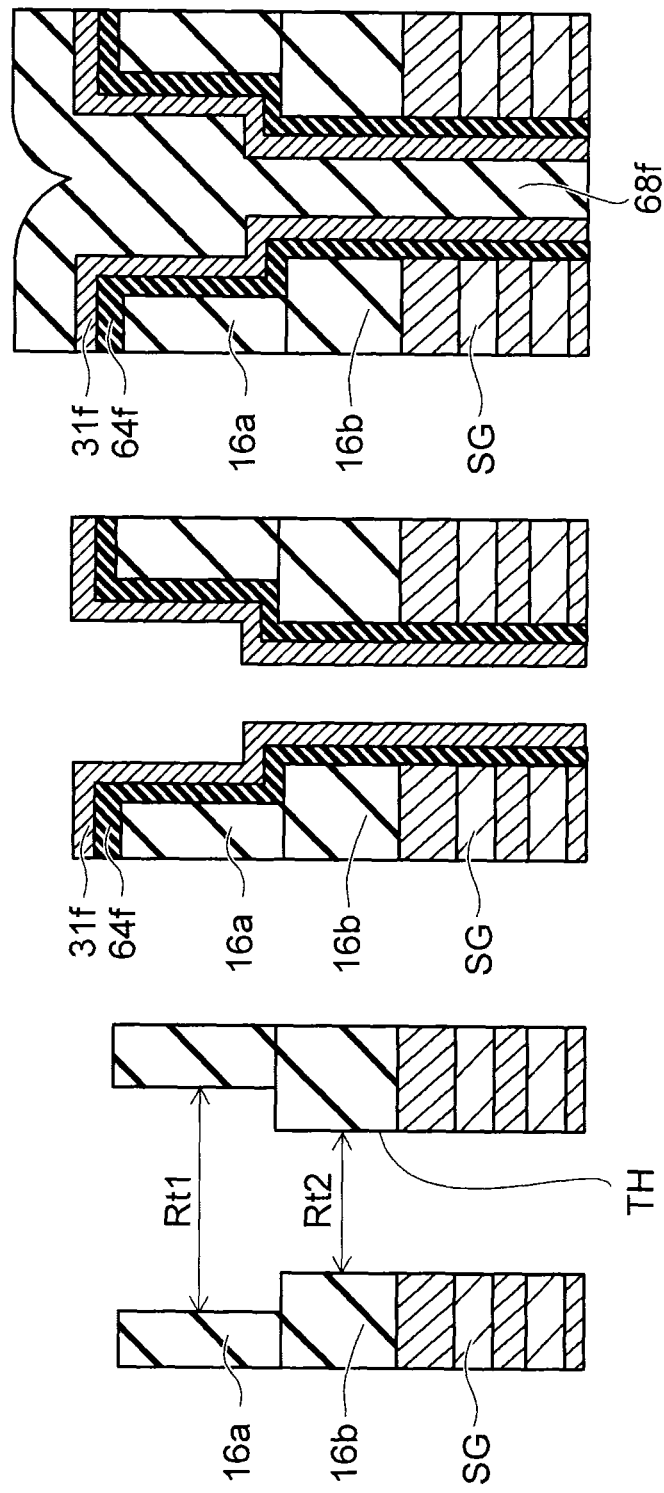

NONVOLATILE SEMICONDUCTOR
MEMORY DEVICE AND METHOD FOR
MANUFACTURING SAME

CROSS-REFERENCE TO RELATED
APPLICATIONS

This application is based upon and claims the benefit of priority from Japanese Patent Application No. 2014-057971, filed on Mar. 20, 2014; the entire contents of which are incorporated herein by reference.

FIELD

Embodiments described herein relate generally to a nonvolatile semiconductor memory device and a method for manufacturing same.

BACKGROUND

There is a nonvolatile semiconductor memory device having a three-dimensional structure. For example, a through-hole is made in a stacked body in which electrode films and insulating films are multiply stacked alternately; and a semiconductor pillar that is used to form a channel is provided on the side wall of the through-hole with a charge storage layer interposed. It is desirable to further suppress the fluctuation of the characteristics of such a nonvolatile semiconductor memory device.

BRIEF DESCRIPTION OF THE DRAWINGS

FIG. 4A to FIG. 4C are schematic views illustrating some of the manufacturing processes of the semiconductor device according to the first embodiment;

DETAILED DESCRIPTION

Figure 1:
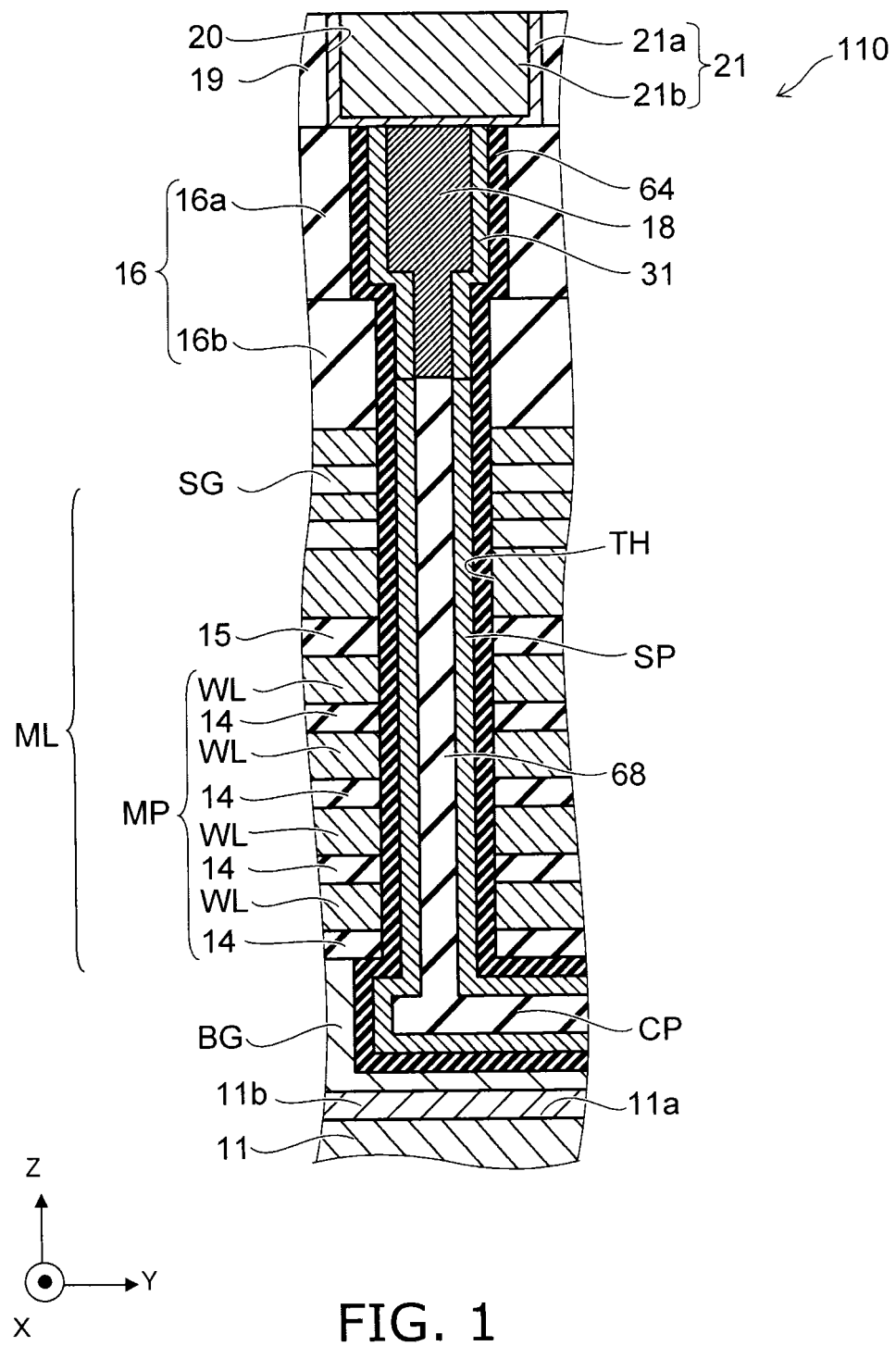
FIG. 1 is a schematic cross-sectional view illustrating a nonvolatile semiconductor memory device according to a first embodiment.

According to one embodiment, a nonvolatile semiconductor memory device includes an interconnect layer, a stacked body, an insulating layer, a semiconductor pillar, a charge storage layer and a first conductive unit. The stacked body is separated from the interconnect layer in a first direction. The stacked body includes a memory unit and a selection gate. The memory unit includes a plurality of electrode films and a plurality of inter-electrode insulating films stacked alternately in the first direction. The selection gate is provided between the memory unit and the interconnect layer. The insulating layer is provided between the interconnect layer and the stacked body. The semiconductor pillar pierces the stacked body in the first direction. The charge storage layer is provided between the semiconductor pillar and each of the plurality of electrode films. The first conductive unit connects the semiconductor pillar and the interconnect layer. A width of the first conductive unit along a second direction perpendicular to the first direction is wider than a width of the semiconductor pillar along the second direction.

According to one embodiment, a method for manufacturing a nonvolatile semiconductor memory device is disclosed. The method includes forming a stacked body by stacking a selection gate on a plurality of electrode films and a plurality of inter-electrode insulating films stacked alternately in a first direction. The method includes forming a first insulating portion on the stacked body. The method includes forming a second insulating portion on the first insulating portion. An etching rate for dilute hydrofluoric acid of the second insulating portion is higher than an etching rate for dilute hydrofluoric acid of the first insulating portion. The method includes making a through-hole piercing the stacked body, the first insulating portion, and the second insulating portion in the first direction. The method includes etching the first insulating portion and the second insulating portion using dilute hydrofluoric acid to cause a width of a portion of the through-hole piercing the second insulating portion to be wider than a width of a portion of the through-hole piercing the first insulating portion. The method includes forming an insulating film on an inner surface of the through-hole. The method includes forming a semiconductor film in the remaining space of the through-hole.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view illustrating a nonvolatile semiconductor memory device according to a first embodiment.

Figure 2:
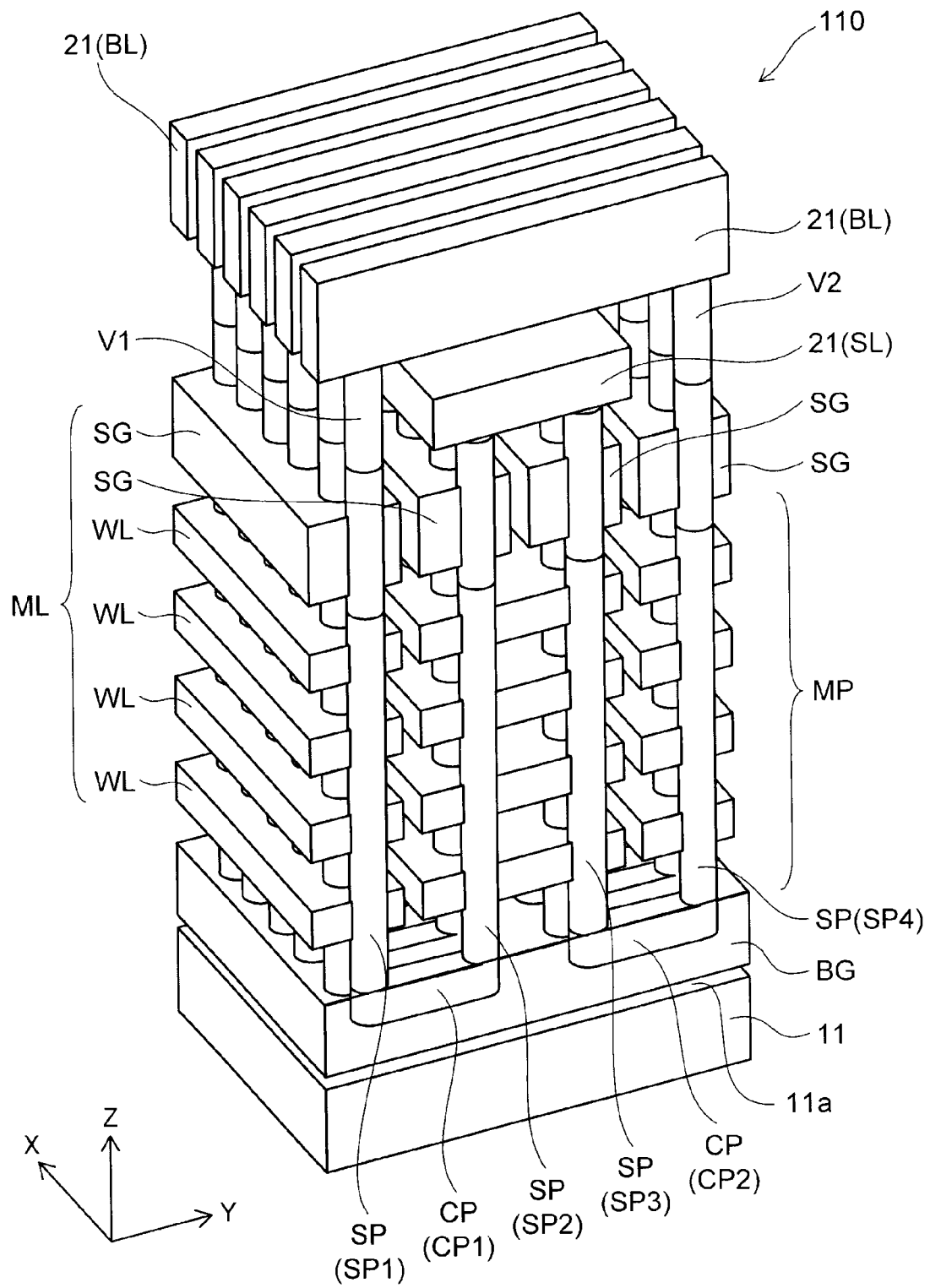
FIG. 2 is a schematic perspective view illustrating the nonvolatile semiconductor memory device according to the first embodiment.

FIG. 2 is a schematic perspective view illustrating the nonvolatile semiconductor memory device according to the first embodiment.

For easier viewing of the drawing in FIG. 2, only the conductive portions are shown; and the insulating portions are not shown.

First, an example of the overview of the nonvolatile semiconductor memory device according to the embodiment will be described using FIG. 1 and FIG. 2.

The nonvolatile semiconductor memory device 110 according to the embodiment is three-dimensionally stacked flash memory; and cell transistors are arranged in a three-dimensional matrix configuration in the nonvolatile semiconductor memory device 110. A charge storage layer is provided at each of the cell transistors; and each of the cell transistors functions as a memory cell that stores data by storing charge in the charge storage layer.

As shown in FIG. 1, the nonvolatile semiconductor memory device 110 includes a stacked body ML, an insulating layer 16, an interconnect layer 21, a semiconductor pillar SP, a charge storage layer 63, and a first conductive unit 31.

The stacked body ML is separated from the interconnect layer 21 in the first direction. The insulating layer 16 is provided between the interconnect layer 21 and the stacked body ML. The interconnect layer 21, the insulating layer 16, and the stacked body ML are stacked in the first direction. The insulating layer 16 includes, for example, silicon oxide.

The stacking direction (a first direction) of the interconnect layer 21 and the stacked body ML is taken as a Z-axis direction. One direction perpendicular to the Z-axis direction is taken as an X-axis direction. One direction perpendicular to the Z-axis direction and perpendicular to the X-axis direction is taken as a Y-axis direction.

For example, a substrate 11 is provided in the nonvolatile semiconductor memory device 110. The substrate 11 includes, for example, a semiconductor such as monocrystalline silicon, etc. In the substrate 11, a memory array region where memory cells are formed is set; and a circuit region that drives the memory cells is set. FIG. 1 and FIG. 2 show the memory array region; and the circuit region is not shown. As shown in FIG. 2, the interconnect layer 21 includes a source line SL and a bit line BL.

In the memory array region, the stacked body ML is formed on a major surface 11a of the substrate 11. In the example, an inter-layer insulating film 11b is provided on the major surface 11a of the substrate 11; a back gate BG is provided on the inter-layer insulating film 11b; and the stacked body ML is provided on the back gate BG.

The stacked body ML includes a memory unit MP and a selection gate SG. The selection gate SG is provided between the memory unit MP and the interconnect layer 21. The selection gate SG may include any conductive material; and, for example, polysilicon may be used. The selection gate SG is formed by dividing a conductive film along a constant direction; and in the example, the selection gate SG is separated along the Y-axis direction. In other words, the selection gate SG is a conductive member having multiple interconnect configurations extending in the X-axis direction.

In the memory unit MP, multiple electrode films WL and multiple inter-electrode insulating films 14 are stacked alternately in the Z-axis direction.

The electrode film WL may include any conductive material, e.g., polysilicon or amorphous silicon to which an impurity is introduced to provide conductivity, a metal, an alloy, etc. A prescribed potential is applied to the electrode film WL by a driver circuit (not shown) formed in the circuit region; and the electrode film WL functions as the word line of the nonvolatile semiconductor memory device 110. The electrode film WL is, for example, a conductive film parallel to the X-Y plane and is separated, for example, into erasing block units. Similarly to the selection gate SG, for example, the electrode film WL may be separated to extend in the X-axis direction.

The semiconductor pillar SP pierces the stacked body ML in the Z-axis direction. For example, multiple through-holes TH that extend in the Z-axis direction are made in the stacked body ML; an insulating film is provided on the side surfaces in the interiors of the multiple through-holes TH; and a semiconductor material is filled into the space inside the insulating film to form the semiconductor pillar SP. The semiconductor pillar SP includes, for example, amorphous silicon.

The semiconductor pillar SP is multiply provided in the X-Y plane; and in this specific example, two semiconductor pillars SP arranged to be adjacent to each other in the Y-axis direction are used as one pair. In other words, the nonvolatile semiconductor memory device 110 further includes a first connection portion CP1 (a connection portion CP) that electrically connects a first semiconductor pillar SP1 and a second semiconductor pillar SP2 on the substrate 11 side. In other words, the first and second semiconductor pillars SP1 and SP2 are connected by the first connection portion CP1 and function as one NAND string having a U-shaped configuration. Third and fourth semiconductor pillars SP3 and SP4 that are adjacent to the second semiconductor pillar SP2 on the side opposite to the first semiconductor pillar SP1 in the Y-axis direction are connected by a second connection portion CP2 and function as another NAND string having a U-shaped configuration. Thus, every two semiconductor pillars SP are used as a pair.

Then, for example, the two adjacent semiconductor pillars (the semiconductor pillars SP2 and SP3) that are on the inside of two NAND strings having U-shaped configurations are connected to the source line SL; and the two semiconductor pillars (the semiconductor pillars SP1 and SP4) that are on the outside are connected to the same bit line BL by through-electrodes V1 and V2, respectively. However, the embodiment is not limited thereto; and each of the semiconductor pillars SP may be independent. In such a case, the semiconductor pillars SP are not connected by the connection portion CP.

For example, the electrode films WL that correspond to the semiconductor pillars SP1 and SP4 are commonly connected; and the electrode films WL that correspond to the semiconductor pillars SP2 and SP3 are commonly connected. The electrode films WL may have a structure of inter digital electrodes (or multi-finger electrodes) in which the electrode films WL are combined in comb teeth configurations opposing each other in the X-axis direction.

For example, the electrode films WL that correspond to the semiconductor pillars SP1 and SP4 and the electrode films WL that correspond to the semiconductor pillars SP2 and SP3 are electrically connected at the two X-axis direction ends to the peripheral circuit provided in the substrate 11. For example, each of the electrode films WL is connected to the peripheral circuit at an X-axis direction end of each of the electrode films WL.

Thereby, the memory cells of the same layer corresponding to the semiconductor pillar SP1 and the semiconductor pillar SP2 can be operated independently from each other; and the memory cells of the same layer corresponding to the semiconductor pillar SP3 and the semiconductor pillar SP4 can be operated independently from each other.

A combination of the electrode films WL that correspond to the semiconductor pillars SP1 and SP4 and the electrode films WL that correspond to the semiconductor pillars SP2 and SP3 may be used as one erasing block; and the electrode films are separated every erasing block. The number of semiconductor pillars in the X-axis direction and the number of semiconductor pillars in the Y-axis direction are arbitrary for the semiconductor pillars included in each erasing block.

Figure 3A:
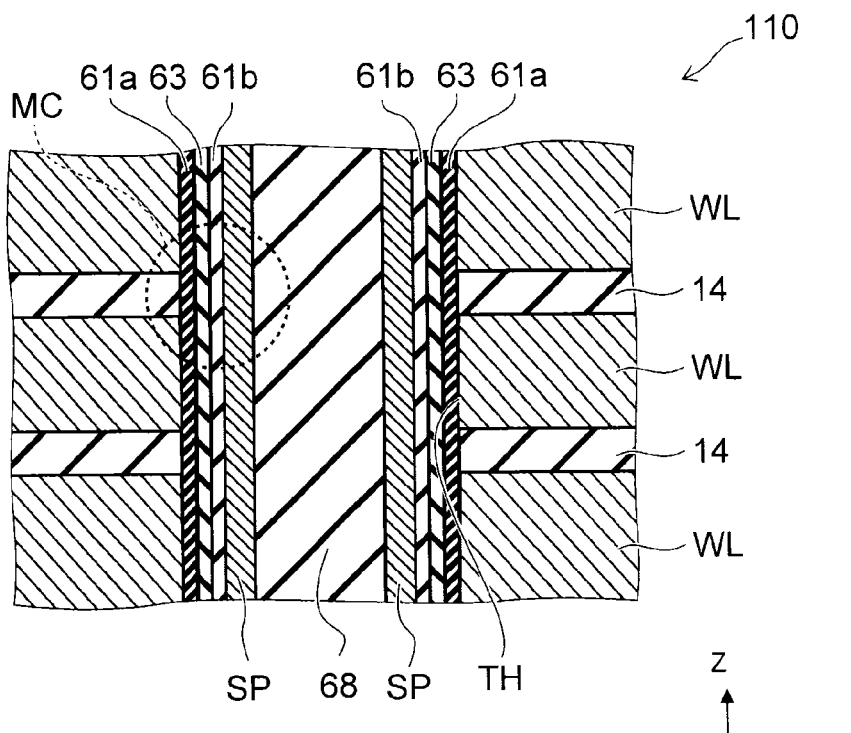
FIG. 3A and FIG. 3B are schematic cross-sectional views illustrating the nonvolatile semiconductor memory device according to the first embodiment.
Figure 3B:
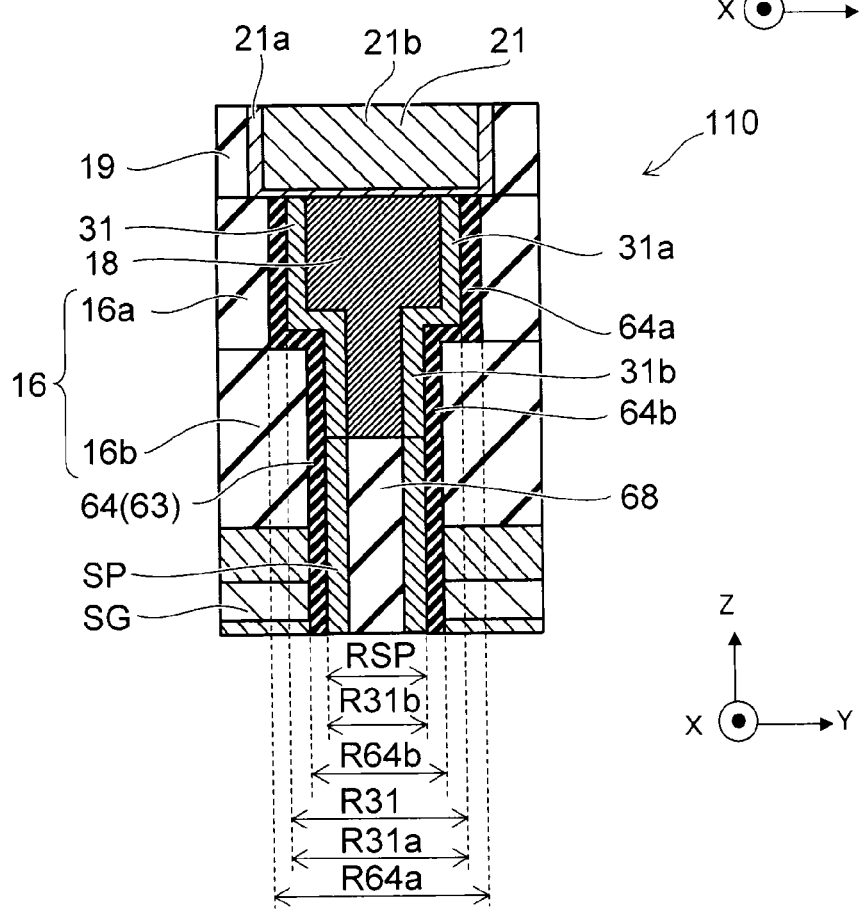

FIG. 3A and FIG. 3B are schematic cross-sectional views illustrating the nonvolatile semiconductor memory device according to the first embodiment.

FIG. 3A shows an enlarged portion corresponding to the memory unit MP shown in FIG. 1. FIG. 3B shows an enlarged portion corresponding to the insulating layer 16 shown in FIG. 1.

For example, the cross section when the semiconductor pillar SP is cut by a plane orthogonal to the Z-axis direction has an annular configuration. As shown in FIG. 3A, a core unit 68 is filled inside the semiconductor pillar SP. The core unit 68 includes, for example, silicon oxide.

The charge storage layer 63 is provided between the semiconductor pillar SP and each of the multiple electrode films WL, and between the semiconductor pillar SP and each of the multiple inter-electrode insulating films 14. Further, a first memory insulating film 61a is provided between the charge storage layer 63 and each of the multiple electrode films WL, and between the charge storage layer 63 and each of the multiple inter-electrode insulating films 14. Also, a second memory insulating film 61b is provided between the semiconductor pillar SP and the charge storage layer 63. The charge storage layer 63 includes, for example, a silicon nitride film. The first memory insulating film 61a and the second memory insulating film 61b include, for example, silicon oxide.

For example, an electric field is applied between the semiconductor pillar SP and the electrode film WL. Thereby, the charge storage layer 63 functions as a memory layer that stores or discharges charge. The inter-electrode insulating film 14 functions as an inter-layer insulating film that insulates the electrode films WL from each other. The first memory insulating film 61a that is provided between the charge storage layer 63 and the electrode films WL functions as a blocking insulating film; and the second memory insulating film 61b that is provided between the semiconductor pillar SP and the charge storage layer 63 functions as a tunneling insulating film. The proximal region at the portion where the semiconductor pillar SP and the electrode film WL oppose each other is used as one memory cell MC.

As shown in FIG. 3B, a conductive layer 18 is provided between the core unit 68 and the interconnect layer 21. The conductive layer 18 connects the core unit 68 and the interconnect layer 21 and has, for example, a columnar configuration. The interconnect layer 21 includes, for example, a W film 21b, a TiN film 21a, and an inter-layer insulating film 19. The TiN film 21a is provided between the W film 21b and the conductive layer 18.

The first conductive unit 31 that connects the semiconductor pillar SP and the interconnect layer 21 is provided in the nonvolatile semiconductor memory device 110. The first conductive unit 31 is provided between the conductive layer 18 and the insulating layer 16. The first conductive unit includes, for example, amorphous silicon. The first conductive unit 31 is, for example, a source-drain diffusion region including phosphorus (P).

The configuration of the cross section of the first conductive unit 31 cut in a plane parallel to the X-Y plane is an annular configuration. The first conductive unit 31 is provided around the conductive layer 18 in the X-Y plane. A width R31 of the first conductive unit 31 (i.e., the outer diameter of the first conductive unit 31) along the second direction perpendicular to the Z-axis direction is wider than a width RSP of the semiconductor pillar SP (i.e., the outer diameter of the semiconductor pillar SP) along the second direction.

In the example, the first conductive unit 31 includes a first region 31a and a second region 31b. The second region 31b is provided at a position between the first region 31a and the semiconductor pillar SP in the Z-axis direction. A width R31a of the first region 31a (i.e., the outer diameter of the first region 31a) along the second direction is wider than a width R31b of the second region 31b (i.e., the outer diameter of the second region 31b) along the second direction.

A first insulating film 64 is provided between the first conductive unit 31 and the insulating layer 16. The first insulating film 64 is formed simultaneously with the charge storage layer 63 and is provided to be continuous with the charge storage layer 63. The first insulating film 64 is provided around the first conductive unit 31 in the X-Y plane. The first insulating film 64 is, for example, a silicon nitride film. In the example, the first insulating film 64 includes a first film unit 64a and a second film unit 64b. The second film unit 64b is provided at a position between the first film unit 64a and the charge storage layer 63 in the Z-axis direction. A width R64a of the first film unit 64a (i.e., the outer diameter of the first film unit 64a) along the second direction is wider than a width R64b of the second film unit 64b along the second direction.

The insulating layer 16 includes a first portion 16a and a second portion 16b. The second portion 16b is provided between the first portion 16a and the stacked body ML. The width along the second direction of the first portion 16a is narrower than the width along the second direction of the second portion 16b.

The length along the Z-axis direction of the first portion 16a is not less than 0.25 times the length along the Z-axis direction of the second portion 16b. It is favorable for the length (the height) along the Z-axis direction of the first portion 16a to be longer than the length (the height) along the Z-axis direction of the second portion 16b.

The material included in the first portion 16a is different from the material included in the second portion 16b. For example, the density of the first portion 16a is lower than the density of the second portion 16b. For example, the etching rate for dilute hydrofluoric acid of the first portion 16a is higher than the etching rate for dilute hydrofluoric acid of the second portion 16b. Thereby, for example, in the manufacturing processes described below, the outer diameter of the first film unit 64a can be set to be larger than the outer diameter of the second film unit 64b as described above. The process of filling the core unit 68 described below becomes easier.

FIG. 4A to FIG. 4C and FIG. 5A to FIG. 5C are schematic views illustrating some of the manufacturing processes of the semiconductor device according to the first embodiment.

The inter-layer insulating film 11b and the back gate BG are formed on the substrate 11. The inter-electrode insulating films 14 and the electrode films WL are stacked alternately on the inter-layer insulating film 11b and the back gate BG. The stacked body ML is formed by further stacking the selection gate SG on the inter-electrode insulating films 14 and the electrode films WL.

As shown in FIG. 4A, the insulating layer 16 is formed on the stacked body ML. For example, the second portion 16b (the first insulating portion) is stacked on the stacked body ML; and the first portion 16a (the second insulating portion) is stacked on the second portion 16b. Subsequently, the through-hole TH is made by photolithography and RIE (Reactive Ion Etching). The through-hole TH pierces the stacked body ML and the insulating layer 16 in the Z-axis direction (the direction from the stacked body ML toward the first insulating portion).

Subsequently, for example, wet etching using dilute hydrofluoric acid (DHF) is performed. As described above, for example, the etching rate of the first portion 16a is different from the etching rate of the second portion 16b. Thereby, the width of the portion of the through-hole TH piercing the second insulating portion (the first portion 16a) is wider than the width of the portion of the through-hole TH piercing the first insulating portion (the second portion 16b).

Subsequently, as shown in FIG. 4B, an insulating film 64f that is used to form the charge storage layer 63 and the first insulating film 64 is stacked on the inner surface of the through-hole TH. A semiconductor film 31f that is used to form the semiconductor pillar SP and the first conductive unit 31 is stacked on the insulating film 64*f*.

Subsequently, as shown in FIG. 4C, a core unit insulating film 68*f* that is used to form the core unit 68 is filled inside the semiconductor film 31*f*. For example, the filling includes CVD (Chemical Vapor Deposition). At this time, as described above, an inner diameter Rt1 is larger than an inner diameter Rt2. Thereby, the fillability of the core unit insulating film 68*f* improves.

Figure 5C:
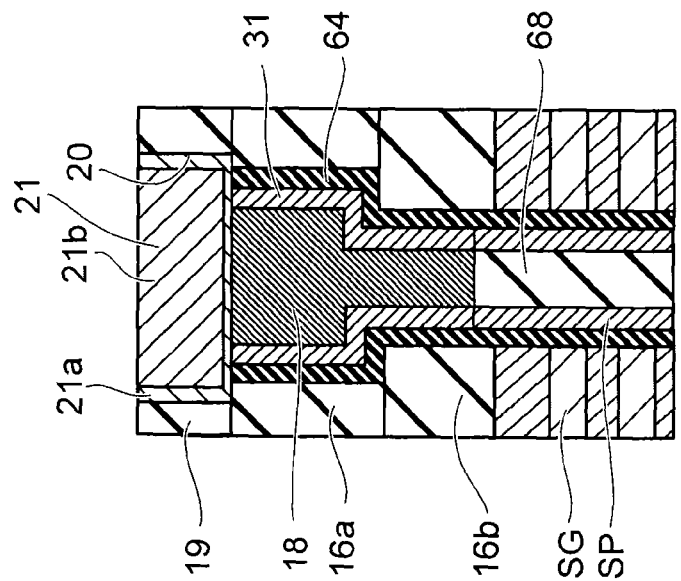
FIG. 5A to FIG. 5C are schematic views illustrating some of the manufacturing processes of the semiconductor device according to the first embodiment.
Figure 5B:
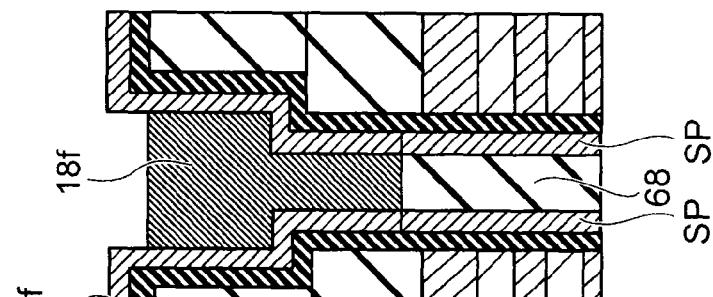
Figure 5A:
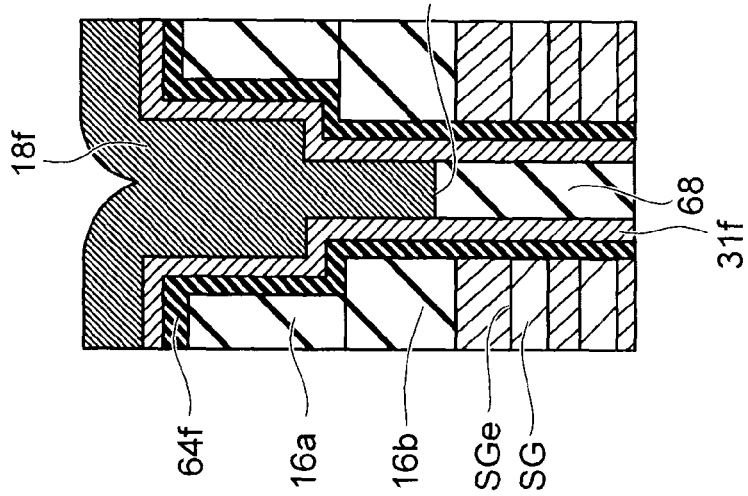

FIG. 5A to FIG. 5C show the processes after FIG. 4A to FIG. 4C. As shown in FIG. 5A, etch-back of the upper portion of the core unit insulating film 68*f* is performed. At this time, for example, an upper end 68*e* of the core unit insulating film 68*f* is recessed (caused to recede) to be higher than an upper end SGe of the selection gate SG. Thereby, the core unit 68 is formed. Subsequently, a semiconductor layer 18*f* that is used to form the conductive layer 18 is filled on top of the core unit 68.

An impurity (P) is doped into the semiconductor layer 18*f*; and the impurity is diffused into the semiconductor film 31*f* by performing heat treatment. Thereby, the source-drain diffusion region (the first conductive unit 31) that is doped with the impurity is formed.

Subsequently, as shown in FIG. 5C, the upper portions of the semiconductor layer 18*f*, the semiconductor film 31*f*, and the insulating film 64*f* are removed; and the interconnect layer 21 is formed on the semiconductor layer 18*f*, the semiconductor film 31*f*, and the insulating film 64*f*. The inter-layer insulating film 19 is deposited; a trench 20 is made in the inter-layer insulating film 19; and the TiN film 21*a* and the W film 21*b* are filled into the trench 20.

Thus, the nonvolatile semiconductor memory device 110 shown in FIG. 1 is manufactured.

Thus, in the embodiment, the first portion 16*a* and the second portion 16*b* that have mutually-different etching rates are provided. Thereby, as described above, the inner diameter Rt1 (the length along the second direction) of the through-hole TH in the first portion 16*a* is larger than the inner diameter Rt2 of the through-hole TH in the second portion 16*b*. In other words, the width R31 of the first conductive unit 31 along the X-axis direction is wider than the width RSP of the semiconductor pillar SP along the X-axis direction. Therefore, as described in FIG. 4C, the fillability of the core unit insulating film 68*f* can be improved.

Conversely, there is a nonvolatile semiconductor memory device of a reference example in which the first portion 16*a* and the second portion 16*b* are not provided in the insulating layer 16. In the manufacturing processes of such a nonvolatile semiconductor device, the inner diameter of the configuration of the through-hole TH easily becomes narrow toward the upper portion (along the direction from the stacked body ML toward the insulating layer 16). In other words, the configuration of the through-hole TH easily becomes a reverse-tapered configuration. In such a case, cavities (voids) may form inside the through-hole TH after the process of filling the core unit insulating film 68*f*.

In the case where such voids form, the position of the upper end 68*e* of the core unit 68 fluctuates easily in the process of performing etch-back of the upper portion of the core unit insulating film 68*f* described in regard to FIG. 5A. In other words, the fluctuation of the distance along the Z-axis direction becomes large between the selection gate SG and the semiconductor layer 18*f* formed subsequently. Because the first conductive unit 31 (the source-drain diffusion region) is formed according to the position of the semiconductor layer 18*f*, the fluctuation of the distance between the source-drain diffusion region and the selection gate SG becomes large. Therefore, the fluctuation of the characteristics of the transistor including the selection gate SG undesirably becomes large.

For example, there is a method of another reference example in which the filling of the core unit insulating film 68*f* is performed by being divided into two or more filling processes to avoid the formation of the voids. In such a case, the manufacturing efficiency undesirably decreases because the etch-back and the filling of the core unit insulating film 68*f* are repeated.

Conversely, in the embodiment, the fluctuation of the position of the upper end 68*e* of the core unit 68 is reduced by using one filling process by improving the fillability of the core unit insulating film 68*f*. Thereby, the fluctuation of the characteristics of the transistor of the selection gate SG can be suppressed.

Further, in the embodiment, because the inner diameter of the through-hole TH is set to be large, the diameter of the electrode can be set to be large; and the electrical resistance can be reduced. When forming the interconnect layer 21, the process margin of the alignment between the interconnect layer 21 and the through-hole TH can be larger.

Second Embodiment

Figure 6:
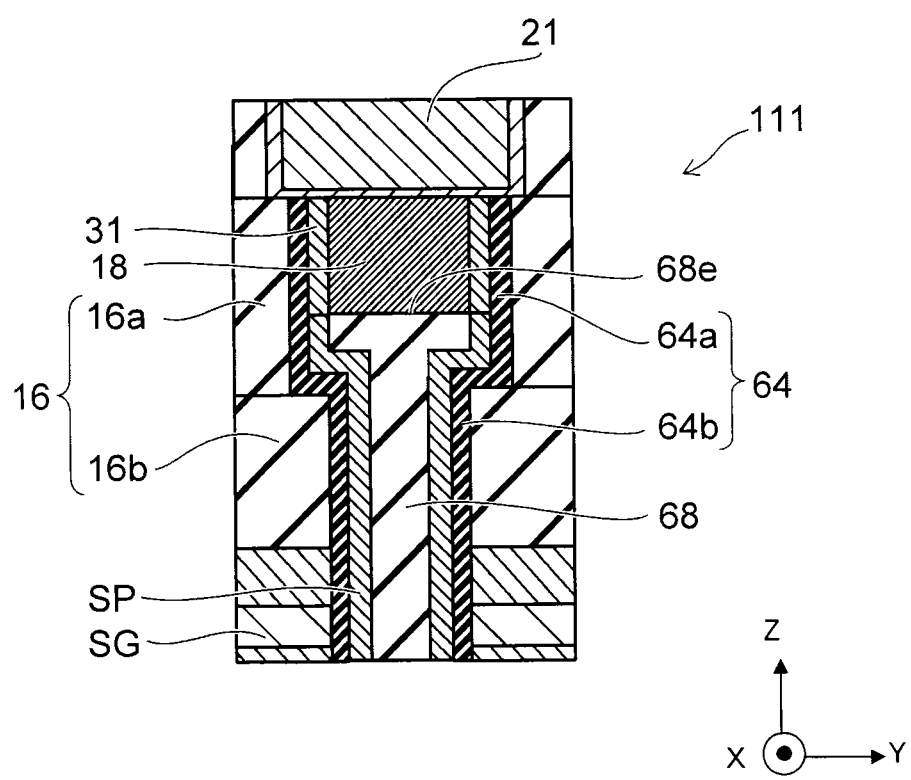
FIG. 6 is a schematic cross-sectional view illustrating a nonvolatile semiconductor memory device according to a second embodiment.

FIG. 6 is a schematic cross-sectional view illustrating a nonvolatile semiconductor memory device according to a second embodiment.

The stacked body ML, the insulating layer 16, the interconnect layer 21, the semiconductor pillar SP, the charge storage layer 63, the first conductive unit 31, the core unit 68, etc., are provided in the nonvolatile semiconductor memory device 111 as well.

FIG. 6 shows an enlarged portion corresponding to the insulating layer 16 of the nonvolatile semiconductor memory device 111.

In the nonvolatile semiconductor memory device 111 as shown in FIG. 6, the position in the Z-axis direction of the upper end 68*e* of the core unit 68 (the boundary between the core unit 68 and the conductive layer 18) is positioned to be higher than the position in the Z-axis direction of the boundary between the first portion 16*a* and the second portion 16*b*. In other words, the position in the Z-axis direction of the upper end 68*e* is positioned between the position in the Z-axis direction of the second portion 16*b* and the position in the Z-axis direction of the interconnect layer 21.

For example, the first insulating film 64 includes the first film unit 64*a* and the second film unit 64*b* in the nonvolatile semiconductor memory device 111 as well. The width R64*a* of the first film unit 64*a* (i.e., the outer diameter of the first film unit 64*a*) along the second direction is wider than the width R64*b* of the second film unit 64*b* along the second direction. The width along the second direction of the first portion 16*a* is narrower than the width along the second direction of the second portion 16*b*. Thereby, the fillability of the core unit insulating film 68*f* improves; and the fluctuation of the characteristics of the transistor of the selection gate SG can be suppressed.

According to the embodiments, a nonvolatile semiconductor device and a method for manufacturing the nonvolatile semiconductor device in which the fluctuation of the characteristics is suppressed can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components such as the interconnect layer, the memory unit, the selection gate, the semiconductor pillar, the insulating layer, the conductive unit, the charge storage layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all nonvolatile semiconductor memory devices and all methods for manufacturing same practicable by an appropriate design modification by one skilled in the art based on the nonvolatile semiconductor memory devices and the method for manufacturing same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
    an interconnect layer;
    a stacked body separated from the interconnect layer in a first direction, the stacked body including
        a memory unit including a plurality of electrode films and a plurality of inter-electrode insulating films stacked alternately in the first direction, and
        a selection gate provided between the memory unit and the interconnect layer;
    an insulating layer provided between the interconnect layer and the stacked body;
    a semiconductor pillar piercing the stacked body in the first direction;
    a charge storage layer provided between the semiconductor pillar and each of the plurality of electrode films; and
    a first conductive unit connecting the semiconductor pillar and the interconnect layer, the first conductive unit including
        a first region, and
        a second region provided between the first region and the semiconductor pillar;
    a width of the first conductive unit along a second direction perpendicular to the first direction being wider than a width of the semiconductor pillar along the second direction,
    a width along the second direction of the first region being wider than a width along the second direction of the second region.

2. The device according to claim 1, further comprising a first memory insulating film provided between the charge storage layer and each of the plurality of electrode films and between the charge storage layer and each of the plurality of inter-electrode insulating films.

3. The device according to claim 2, further comprising a second memory insulating film provided between the semiconductor pillar and the charge storage layer.

4. The device according to claim 3, wherein
    the first memory insulating film includes silicon oxide, and
    the second memory insulating film includes silicon oxide.

5. The device according to claim 1, further comprising a core unit including silicon oxide,
    a cross section of the semiconductor pillar having an annular configuration in a plane perpendicular to the first direction,
    the core unit being provided inside the semiconductor pillar.

6. The device according to claim 5, further comprising a conductive layer provided between the core unit and the interconnect layer to connect the core unit and the interconnect layer.

7. The device according to claim 1, wherein the insulating layer includes silicon oxide.

8. The device according to claim 1, wherein the first conductive unit includes amorphous silicon including phosphorus.

9. A nonvolatile semiconductor memory device, comprising:
    an interconnect layer;
    a stacked body separated from the interconnect layer in a first direction, the stacked body including
        a memory unit including a plurality of electrode films and a plurality of inter-electrode insulating films stacked alternately in the first direction, and
        a selection gate provided between the memory unit and the interconnect layer;
    an insulating layer provided between the interconnect layer and the stacked body;
    a semiconductor pillar piercing the stacked body in the first direction;
    a charge storage layer provided between the semiconductor pillar and each of the plurality of electrode films;
    a first conductive unit connecting the semiconductor pillar and the interconnect layer; and
    a first insulating film provided between the first conductive unit and the insulating layer and between the semiconductor pillar and the insulating layer,
    the first insulating film including
        a first film unit, and
        a second film unit provided between the first film unit and the charge storage layer,
    a width of the first conductive unit along a second direction perpendicular to the first direction being wider than a width of the semiconductor pillar along the second direction, and
    a width along the second direction of the first film unit being wider than a width along the second direction of the second film unit.

10. A nonvolatile semiconductor memory device, comprising:
    an interconnect layer;

a stacked body separated from the interconnect layer in a first direction, the stacked body including
a memory unit including a plurality of electrode films and a plurality of inter-electrode insulating films stacked alternately in the first direction, and
a selection gate provided between the memory unit and the interconnect layer;
an insulating layer provided between the interconnect layer and the stacked body, the insulating layer including
a first portion, and
a second portion provided between the first portion and the stacked body;
a semiconductor pillar piercing the stacked body in the first direction;
a charge storage layer provided between the semiconductor pillar and each of the plurality of electrode films; and
a first conductive unit connecting the semiconductor pillar and the interconnect layer,
a width of the first conductive unit along a second direction perpendicular to the first direction being wider than a width of the semiconductor pillar along the second direction, and
a width along the second direction of the first portion being narrower than a width along the second direction of the second portion.

11. The device according to claim 10, wherein a length along the first direction of the first portion is not less than 0.25 times a length along the first direction of the second portion.

12. The device according to claim 10, wherein a length along the first direction of the first portion is longer than a length along the first direction of the second portion.

13. The device according to claim 10, wherein a density of the first portion is lower than a density of the second portion.

14. The device according to claim 10, wherein an etching rate for dilute hydrofluoric acid of the first portion is higher than an etching rate for dilute hydrofluoric acid of the second portion.

* * * * *